(12) United States Patent
Fawcett et al.

(10) Patent No.: US 11,223,165 B2
(45) Date of Patent: Jan. 11, 2022

(54) OR RELATING TO PROTECTION RELAYS

(71) Applicant: GENERAL ELECTRIC TECHNOLOGY GMBH, Baden (CH)

(72) Inventors: Timothy Fawcett, Stafford (GB); Simon Kidd, Stafford (GB); Paul Aston, Stafford (GB)

(73) Assignee: General Electric Technology GmbH, Baden (CH)

( * ) Notice: Subject to any disclaimer, the term of this patent is extended or adjusted under 35 U.S.C. 154(b) by 60 days.

(21) Appl. No.: 16/612,244

(22) PCT Filed: Apr. 23, 2018

(86) PCT No.: PCT/EP2018/060344
§ 371 (c)(1),
(2) Date: Nov. 8, 2019

(87) PCT Pub. No.: WO2018/206283
PCT Pub. Date: Nov. 15, 2018

(65) Prior Publication Data
US 2020/0176931 A1    Jun. 4, 2020

(30) Foreign Application Priority Data

May 10, 2017   (EP) .................................... 17170491

(51) Int. Cl.
*H01F 38/32*     (2006.01)
*H01R 12/72*     (2011.01)
(Continued)

(52) U.S. Cl.
CPC ......... *H01R 13/6456* (2013.01); *H01F 38/32* (2013.01); *H01R 12/721* (2013.01);
(Continued)

(58) Field of Classification Search
CPC ....... H01F 38/32; H01R 12/721; H01R 12/72; H01R 13/642; H01R 13/645;
(Continued)

(56) References Cited

U.S. PATENT DOCUMENTS

| 4,464,698 A * | 8/1984 | Yoshizaki | ................ | H02H 3/38 361/79 |
| 5,796,631 A * | 8/1998 | Iancu | ....................... | H02H 3/04 713/340 |

(Continued)

FOREIGN PATENT DOCUMENTS

| DE | 2518137 A1 | 11/1976 |
| JP | 2004213682 A | 7/2004 |
| WO | 2004/042751 A1 | 5/2004 |

OTHER PUBLICATIONS

FP-5000 Protective Relay_pp. 1-176_Apr. 2008.*

(Continued)

*Primary Examiner* — Timothy J Thompson
*Assistant Examiner* — Guillermo J Egoavil
(74) *Attorney, Agent, or Firm* — Eversheds Sutherland (US) LLP

(57) ABSTRACT

A protection relay connection assembly (10) for connecting a current transformer (14) and/or a voltage transformer (16) of an electrical network (12) to a protection relay (18) is provided. The protection relay connection assembly (10) includes a protection relay data acquisition board (20) and a protection relay connector (22). The protection relay data acquisition board (20) includes a first current mating member (24) connectable to a current measurement sensor (28), the current measurement sensor (28) being connectable in use to the protection relay (18) and/or a first voltage mating member (26) connectable to a voltage measurement sensor (30), the voltage measurement sensor (30) being connect- (Continued)

able in use to the protection relay (18). The protection relay connector (22) includes a second current mating member (36) connectable to the current transformer (14) and/or a second voltage mating member (38) connectable to the voltage transformer (16). The first current mating member (24) and the second current mating member (36) are selectively mateable with one another to permit a measured current waveform of the electrical network (12) to be transmitted from the current transformer (14) to the protection relay (18). The first voltage mating member (26) and the second voltage mating member (38) are shaped to be selectively mateable with one another to permit a measured voltage waveform of the electrical network (12) to be transmitted from the voltage transformer (16) to the protection relay (18). Wherein the first current mating member (24) is shaped to prevent mating of the first current mating member (24) with the second voltage mating member (38), and the first voltage mating member (26) is shaped to prevent mating of the first voltage mating member (26) with the second current mating member (36).

14 Claims, 4 Drawing Sheets

(51) Int. Cl.
*H01R 13/645* (2006.01)
*H02H 3/36* (2006.01)
*H05K 1/11* (2006.01)
*H02H 3/38* (2006.01)

(52) U.S. Cl.
CPC ............... *H02H 3/38* (2013.01); *H05K 1/117* (2013.01); *H05K 2201/10151* (2013.01)

(58) Field of Classification Search
CPC ........ H01R 13/6456; H02H 3/38; H02H 3/10; H02H 3/044; H02H 3/08; H02H 3/347; H05K 1/0254; H05K 1/117; H05K 1/11; H05K 2201/09145; H05K 2201/10151; H05K 2203/168; G01R 15/18; G01R 19/2513; G01R 31/327
USPC .................................... 361/88, 418; 336/210
See application file for complete search history.

(56) References Cited

U.S. PATENT DOCUMENTS

| | | | |
|---|---|---|---|
| 6,845,850 B1* | 1/2005 | Schneck | B66B 1/462 187/247 |
| 2011/0182331 A1* | 7/2011 | Jung | H02H 1/0092 375/213 |
| 2017/0077624 A1* | 3/2017 | Marmonier | H01R 9/2416 |

OTHER PUBLICATIONS

SEL Industrial-Catalog_2014_Digital_pp. 1-70_2014.*
SEL-787 Relay_ pp. 1.1 to 10.15_Jan. 30, 2015.*
SEL-787 Data Sheet_pp. 1-24_Mar. 2013.*
SEL-421 Relay Manual_pp. U.1.1 to U.6.45_Dec. 2011.*
International Search Report of PCT/EP2018/060344 dated Jul. 13, 2018.
European Search Report for Application No. 17170491.9 dated Nov. 1, 2017.

* cited by examiner

OR RELATING TO PROTECTION RELAYS

CROSS-REFERENCE TO RELATED APPLICATIONS

This application is a U.S. National Stage Application under 35 U.S.C. 371 and claims the priority benefit of International Application No. PCT/EP2018/060344 filed Apr. 23, 2018, which claims priority to EP17170491.9, filed May 10, 2017, which are both incorporated herein by reference.

This invention relates to a protection relay data acquisition board, a protection relay connector, a protection relay connection assembly and a protection apparatus.

It is known to use a protection relay to protect a section of an electrical network. Moreover, it is known to feed current and/or voltage measurements from the electrical network to the protection relay so as to permit the protection relay to sense a fault on the electrical network.

According to a first aspect of the invention there is provided a protection relay connection assembly for connecting a current transformer and/or a voltage transformer of an electrical network to a protection relay, the protection relay connection assembly comprising:

a protection relay data acquisition board including a first current mating member connectable to a current measurement sensor, the current measurement sensor being connectable in use to the protection relay and/or a first voltage mating member connectable to a voltage measurement sensor, the voltage measurement sensor being connectable in use to the protection relay; and a protection relay connector including a second current mating member connectable to the current transformer and/or a second voltage mating member connectable to the voltage transformer, wherein the first current mating member and the second current mating member are shaped to be selectively mateable with one another to permit a measured current waveform of the electrical network to be transmitted from the current transformer to the protection relay and the first voltage mating member and the second voltage mating member are shaped to be selectively mateable with one another to permit a measured voltage waveform of the electrical network to be transmitted from the voltage transformer to the protection relay, and wherein the first current mating member is shaped to prevent mating of the first current mating member with the second voltage mating member, and the first voltage mating member is shaped to prevent mating of the first voltage mating member with the second current mating member.

The protection relay data acquisition board is mateable to a protection relay connector which is in turn connected to current and/or voltage transformers of an electrical network (i.e. "primary" voltage and current transformers). The protection relay data acquisition board is also connectable in use to a protection relay. Therefore, the protection relay data acquisition board permits current and/or voltage waveforms measured by the primary current and/or voltage transformers of the electrical network to be transmitted, via the protection relay connector, to the protection relay. Such transmission may include the waveforms in an unconverted or converted form.

The protection relay data acquisition board may include one of the following combinations of first current and/or voltage mating members:

one or more first current mating members only;
one or more first voltage mating members only; or
a mixture of first current and voltage mating members.

The protection relay connector may include one of the following combinations of second current and/or voltage mating members:

one or more second current mating members only;
one or more second voltage mating members only; or
a mixture of second current and voltage mating members.

Accordingly, a suitable protection relay data acquisition board and protection relay connector can be chosen to match the requirements of the protection application, e.g. some overcurrent protection relay may not require voltage measurements to operate while a standalone frequency protection relay may not require current measurements to operate.

The primary current and voltage transformer connections each have unique and important requirements such that they need to be treated differently. In particular, it is imperative that the primary current transformer connection is never in an open circuit configuration and the primary voltage transformer connection is never short circuited. Incorrectly connecting the primary current transformer connection to a voltage channel and the primary voltage transformer connection to a current channel may result in significant damage to the components of the electrical network and protection circuit. The protection relay data acquisition board including first current and/or voltage mating members that are shaped to prevent mating of the first current mating member with the second voltage mating member and/or mating of the first voltage mating member with the second current mating member prevents incorrect mating of the protection relay data acquisition board with the protection relay connector in use. It is therefore not possible to incorrectly connect the primary current transformer connection to a voltage channel and the primary voltage transformer connection to a current channel, thus avoiding the aforementioned damage due to incorrect connection.

Therefore, if an operator was to remove the protection relay data acquisition board from the protection relay connector to swap it for another protection relay data acquisition board (which might typically be done for maintenance purposes), the mating members prevent the wrong type of protection relay data acquisition board being inserted into the protection relay connector.

Moreover, the direct physical mating connection between the protection relay data acquisition board and the protection relay connector once the protection relay data acquisition board is inserted into the protection relay connector eliminates the need for wiring of current and voltage measurement sensors to the protection relay connector, thus reducing assembly time and costs.

In contrast, current and voltage measurement sensors (such as "secondary" current and voltage transformers) are conventionally wired to a protection relay connector. Such secondary current and voltage transformers may be permanently connected to the protection relay connector so that they are separate from the rest of the measurement system when it is withdrawn. However, in the event that one of the secondary current and voltage transformers fails, the protection relay has to be taken out of service and physically disconnected, thus significantly increasing the time and cost of repair.

The secondary current and voltage transformers may instead be connected to the protection relay connector using a two-part connector which manages the shorting of the primary current transformers when the protection relay is withdrawn. However, such a solution not only requires a lot of manual wiring, thus resulting in significant assembly times and costs, but also increases the risk of the secondary current and voltage transformers being incorrectly wired to the protection relay connector.

The protection relay data acquisition board of the invention therefore provides a more reliable, safe and cost-effective way to connect a protection relay to the primary current and voltage transformers of the electrical network.

In a particular embodiment of the protection relay connection assembly invention, the current measurement sensor may be connected to the first current mating member and/or the voltage measurement sensor may be connected to the first voltage mating member.

In such embodiments, the current measurement sensor may be configured to convert a measured current waveform of the electrical network to a representative current waveform to be utilised by the protection relay, and/or wherein the voltage measurement sensor may be configured to convert a measured voltage waveform of the electrical network to a representative voltage waveform to be utilised by the protection relay.

Accordingly, the high measured current and/or voltage waveforms of the electrical network taken by the primary current and/or voltage transformers of the electrical network can be converted to a waveform that is within a measurement capability of the protection relay. Therefore, information about the current and/or voltage measurements of the electrical network are able to be transmitted to the protection relay without damaging the protection relay.

In embodiments of the invention where there are both current and voltage measurement sensors, both of the representative current and voltage waveforms may be inputted to the protection relay. The representative current and voltage waveform may instead be converted to a single input which is fed to the protection relay.

Preferably the current measurement sensor is or includes a shunt provided on the protection relay data acquisition board, and/or the voltage measurement sensor is or includes a voltage divider provided on the protection relay data acquisition board.

The provision of a shunt and/or voltage divider provided on the protection relay data acquisition board permits ready manufacture of current and/or voltage measurement sensors within the protection relay connection assembly. In particular, a fully automated manufacturing process can be performed to implement the current and/or voltage measurement sensors on the protection relay data acquisition board. This eliminates the need for wiring of individual current and/or voltage measurement sensors, for example in the form of individual secondary current and/or voltage transformers, to the protection relay connector and mounting such secondary current and/or voltage transformers onto a support structure. Such wiring and mounting is time consuming and costly.

Moreover, the shunt and/or voltage divider being provided on the protection relay data acquisition board means that a single component provides the current and/or voltage measurement sensors as well as a means to correctly mate the protection relay data acquisition board to the protection relay connector. This not only reduces the number of components and speeds up manufacturing lead times, but also means that the current and/or voltage sensors can be easily disconnected from the electrical network for replacement or repair by simply removing the protection relay data acquisition board.

In an embodiment of the invention wherein the protection relay data acquisition board includes a first current mating member, the first current mating member may have at least one dimension that is larger than the corresponding dimension of the second voltage mating member so as to prevent mating of the first current mating member with the second voltage mating member.

In another embodiment of the invention wherein the protection relay data acquisition board includes a first voltage mating member, the first voltage mating member may have at least one dimension that is larger than the corresponding dimension of the second current mating member so as to prevent mating of the first voltage mating member with the second current mating member.

Forming one of the first current and voltage mating members and the other of the second current and voltage mating members in this manner provides a physical means of preventing incorrect connection of the current and/or voltage channels to the primary current and/or voltage transformer connections. For example, the first voltage mating member may have a length or width that is longer than that of the second current mating member, such the one cannot be inserted into the other.

In an embodiment of the invention wherein the protection relay data acquisition board includes a first current mating member, the first current mating member may include a first interference member portion and the second voltage mating member may include a second interference member portion, the first and second interference member portions being shaped to physically interfere with each other to prevent mating of the first current mating member with the second voltage mating member.

In another embodiment of the invention wherein the protection relay data acquisition board includes a first voltage mating member, the first voltage mating member may include a first interference member portion and the second current mating member may include a second interference member portion, the first and second interference member portions being shaped to physically interfere with each other to prevent mating of the first voltage mating member with the second current mating member.

Forming one of the first current and voltage mating members and the other of the second current and voltage mating members in this manner provides a physical means of preventing incorrect connection of the current and/or voltage channels to the primary current and/or voltage transformer connections. For example, the first current mating member may include the first interference member portion and the second voltage mating member may include the second interference member portion, such that the interference portions abutting one another means that one cannot be inserted into the other.

Moreover, such interference member portions may be used in combination with the differing dimensions described above so that there are two different physical barriers preventing incorrect mating of the current and voltage connections.

The first and second current mating members may be associated with at least one current visual indicator and/or the first and second voltage mating members may be associated with at least one voltage visual indicator, the current and voltage visual indicators differing from one another.

Providing such visual indicators clearly identifies to a user which mating members are configured for use with primary current transformer connections and which are configured for use with primary voltage transformer connections, thus simplifying assembly and servicing of the protection relay connection assembly.

Preferably the protection relay data acquisition board is shaped so that the first current mating member is integrally formed with the protection relay data acquisition board and/or the first voltage mating member is integrally formed with the protection relay data acquisition board.

The protection relay data acquisition board being shaped so that the first current and/or voltage mating members are integrally formed therewith means that it is the protection relay data acquisition board itself which forms the first current and/or voltage mating members. This reduces the number of components in the assembly, and a fully automated manufacturing process can be performed to manufacture the first current and/or voltage mating members.

The protection relay data acquisition board may be a printed circuit board (PCB). A PCB can readily be used in a fully automated manufacturing process to have electrical components, such as a shunt and/or voltage divider, formed thereon and to be pressed, stamped or cut to form the first current and/or voltage mating members.

In an embodiment of the invention, one or both of the first current and voltage mating members may have separate poles on opposite faces of the protection relay data acquisition board, each pole being configured to connect to a respective pole of the corresponding one of the current and/or voltage transformers of the electrical network.

In another embodiment of the invention, one or both of the first current and voltage mating members may include first and second mating member portions, each of the first and second mating member portion having a separate pole, each pole being configured to connect to a respective pole of the corresponding one of the current and/or voltage transformers of the electrical network.

Preferably, mating of the first current and/or voltage mating members with the corresponding second current and/or voltage mating members includes insertion of the first current and/or voltage mating members into the second current and/or voltage mating members.

The protection relay connector may include current and/or voltage apertures configured to receive the corresponding first current and/or voltage mating members.

Accordingly, it is the first current and/or voltage mating members of the protection relay data acquisition board that are inserted into the corresponding second current and/or voltage mating members of the protection relay connector. This makes use of current and/or voltage apertures present in a protection relay connector, while a protection relay data acquisition board can be readily shaped (e.g. pressed, stamped or cut) to include protruding members to be inserted into the current and/or voltage apertures.

Optionally the protection relay connector further includes a current mating member cover extending across the current aperture to provide the second current mating member, and/or a voltage mating member cover extending across the voltage aperture to provide the second voltage mating member.

Providing such current and/or voltage mating covers means that the covers can be manufactured separately to match the mating specifications of the first current and/or voltage mating members, and then retro-fitted onto the protection relay connector.

Preferably, mating of the second current and/or voltage mating members with the corresponding first current and/or voltage mating members includes the second current and/or voltage mating members receiving the corresponding second current and/or voltage mating members.

According to a second aspect of the invention there is provided a protection apparatus for protecting an electrical network, the protection apparatus comprising the protection relay connection assembly as described hereinabove, the protection apparatus further comprising one or more inputs electrically coupled with the current and/or voltage measurement sensors, the protection apparatus being configured to be capable of selectively triggering a protective function based on the measured current and/or voltage waveforms to protect the electrical network.

The protection apparatus may be, for example, a protection relay which is configured to trip a circuit breaker when a fault is detected.

The advantages of the second aspect of the invention and its embodiments applies mutatis mutandis to the advantages of the first aspect of the invention and its embodiments.

It will be appreciated that the use of the terms "first" and "second", "primary" and "secondary" and the like, in this patent specification is merely intended to help distinguish between similar features (e.g. the first and second current mating members), and is not intended to indicate the relative importance of one feature over another feature, unless otherwise specified.

Preferred embodiments of the invention will now be described, by way of non-limiting examples, with reference to the accompanying drawings in which.

The figures are not necessarily to scale, and certain features and certain views of the figures may be shown exaggerated in scale or in schematic form in the interests of clarity and conciseness.

Figure 1:
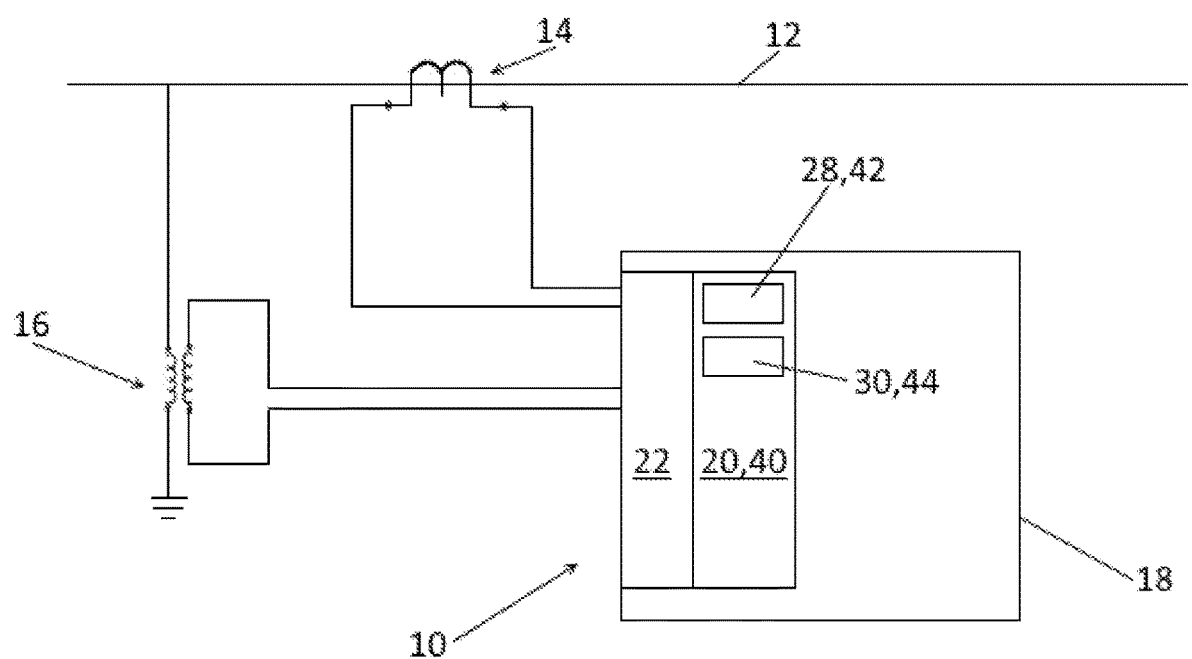
FIG. 1 shows a schematic circuit of a protection relay connection assembly according to a first embodiment of the invention in use with an electrical network.
Figure 2:
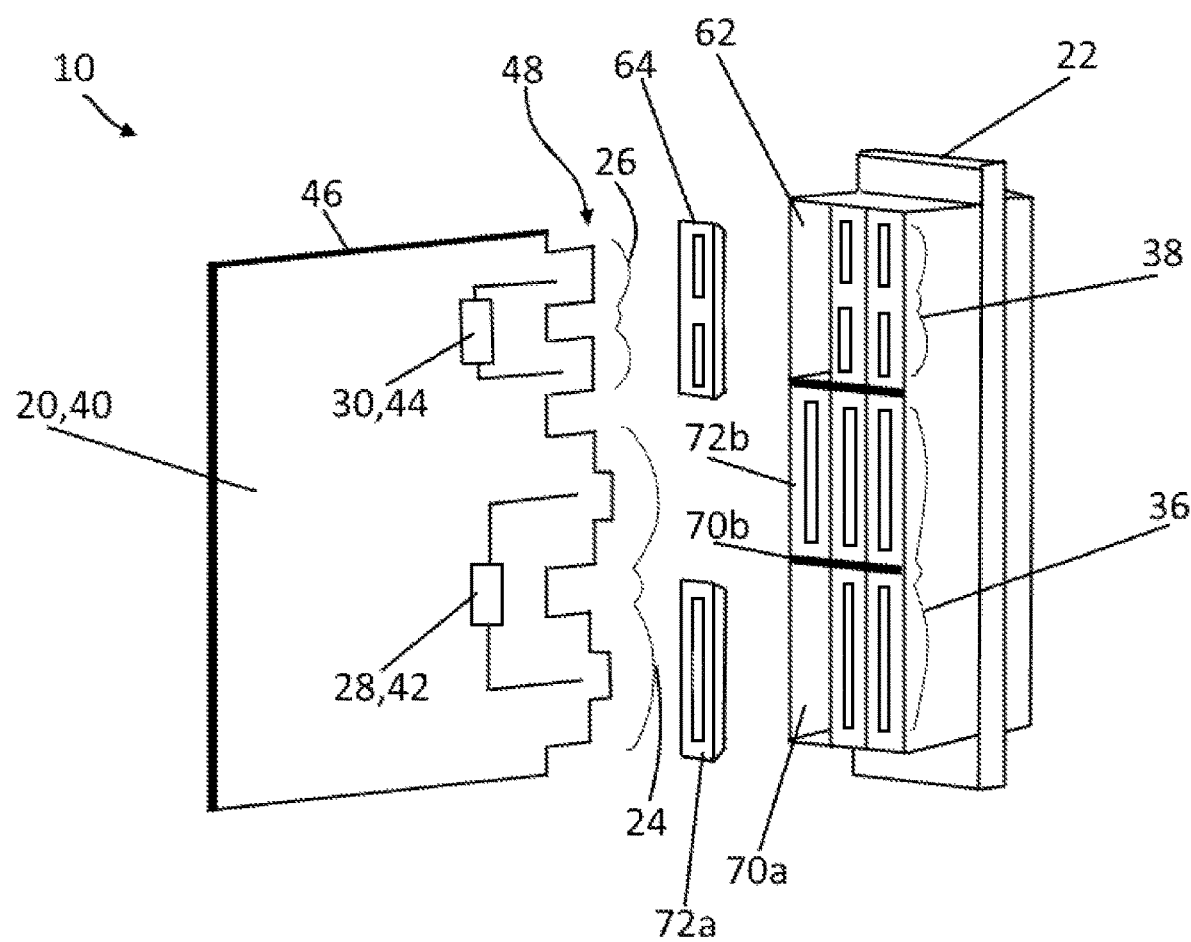
FIG. 2 shows a schematic exploded view of the protection relay connection assembly shown in FIG. 1.

A protection relay connection assembly according to the first embodiment of the invention is designated generally by reference numeral 10 and is shown in FIGS. 1 and 2.

In FIG. 1, the protection relay connection assembly 10 is shown in use with an electrical network 12. In particular, the electrical network 12 includes a primary current transformer 14 connected thereto and a primary voltage transformer 16 connected thereto. The protection relay connection assembly 10 forms part of a protection relay 18.

The protection relay connection assembly 10 includes a protection relay data acquisition board 20 that is electrically coupled to the protection relay 18, and a protection relay connector 22 that is connected to the primary current and voltage transformers 14, 16.

Turning to FIG. 2, the protection relay data acquisition board 20 includes a first current mating member 24 and a first voltage mating member 26. The first current mating member 24 is connected to a current measurement sensor 28 and the first voltage mating member 26 is connected to a voltage measurement sensor 30. The current and voltage measurement sensors 28, 30 provide one or more inputs to the protection relay 18.

The protection relay connector 22 includes a second current mating member 36 and a second voltage mating member 38. The second current mating member 36 is connected to the primary current transformer 14 and the second voltage mating member 38 is connected to the primary voltage transformer 16.

The first and second current mating members 24, 36 are shaped to be mated with one another to permit a measured current waveform from the primary current transformer 14 to be transmitted to the protection relay 18. The first and second voltage mating members 26, 38 are shaped to be mated with one another to permit a measured voltage waveform from the primary voltage transformer 16 to be transmitted to the protection relay 18. The first and second current and voltage mating members 24, 26, 36, 38 are shaped to prevent mating of the first current mating member 24 with the second voltage mating member 38 and mating of the first voltage mating member 26 with the second current mating member 36.

In other embodiments of the invention, the protection relay data acquisition board may include one or more first current mating members only, or one or more first voltage mating members only. Moreover, the protection relay connector may include one or more second current mating members only, or one or more second voltage mating members only.

In the embodiment shown, the protection relay data acquisition board 20 is a printed circuit board (PCB) 40.

Moreover, the current measurement sensor 28 is a shunt 42 which is provided on the PCB 40 and the voltage measurement sensor 30 is a voltage divider 44 also provided in the PCB 40. In this way, the shunt 42 and voltage divider 44 form part of the PCB 40.

Moreover, the shunt 42 converts a current waveform measured from the primary current transformer 14 to a representative current waveform to be utilised by the protection relay 18. In particular, the shunt 42 converts the current waveform of the primary current transformer 14 to a small voltage that is then fed into an analogue-to-digital converter (not shown) present on the PCB 40. The analogue-to-digital converter then produces a digital representation of the current waveform for use by the protection algorithms within the protection relay 18.

The voltage divider 44 converts a voltage waveform measured from the primary voltage transformer 16 to a representative voltage waveform to be utilised by the protection relay 18. In particular, the voltage divider 44 converts the voltage waveform of the primary voltage transformer 16 to a small voltage that is then fed into an analogue-to-digital converter (not shown) present on the PCB 40. The analogue-to-digital converter then produces a digital representation of the voltage waveform for use by the protection algorithms within the protection relay 18.

In other embodiments of the invention (not shown), the current and voltage measurement sensors 28, 30 may take another form such as secondary current and voltage transformers.

As shown in FIG. 2, the PCB 40 itself is shaped to include the first current and voltage mating members 24, 26. In particular, the perimeter 46 of the PCB 40 on one side thereof is shaped so as to have a keying profile 48 that includes the first current and voltage mating members 24, 26.

Figure 3:
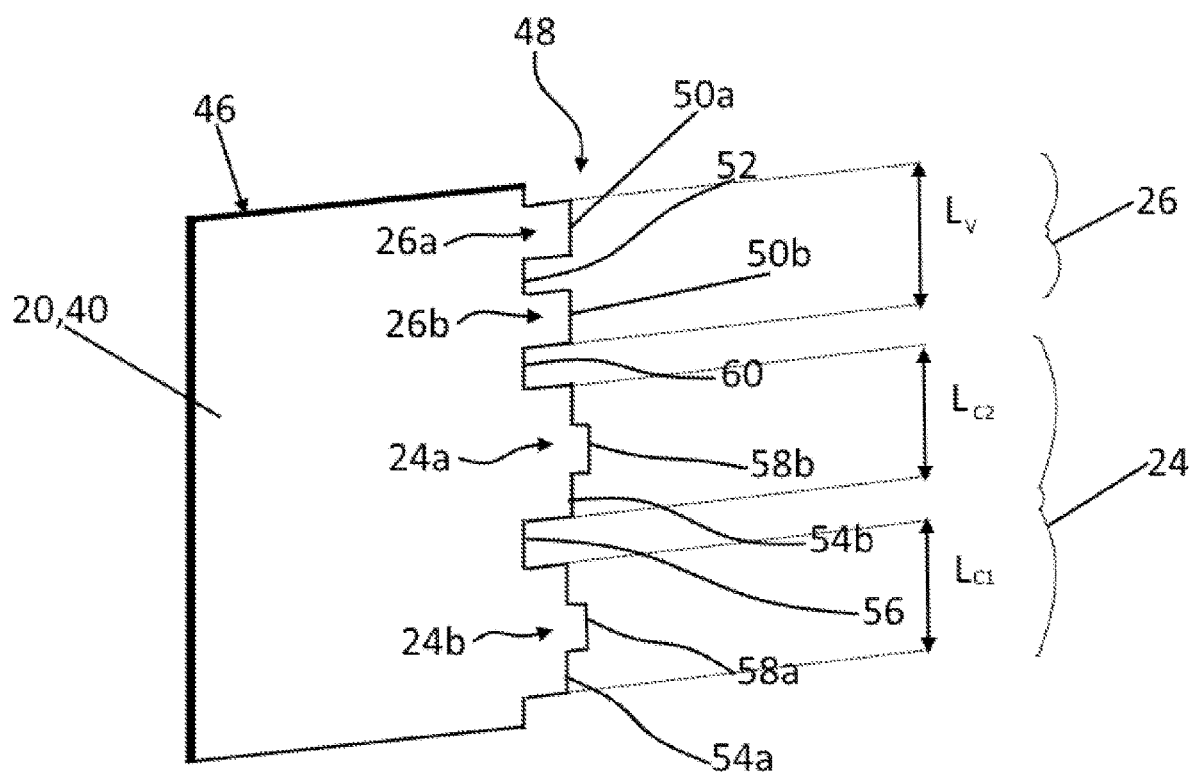
FIG. 3 shows a schematic view of the protection relay data acquisition board shown in FIG. 2.

The keying profile 48 is described in more detail with reference to FIG. 3. In particular, the keying profile 48 forms first and second voltage fingers 50a, 50b which extend from the perimeter 46 of the PCB 40 and are spaced from one another by a voltage spacing perimeter portion 52. The first and second voltage fingers 50a, 50b and voltage perimeter portion 52 define an overall length $L_V$ of the first voltage mating member 26. In this way, the first voltage mating member 26 includes first and second voltage mating member portions 26a, 26b.

Each voltage finger 50a, 50b has separate voltage poles (not shown) to provide the voltage connection to the primary voltage transformer 16. The voltage poles can be on either face of the PCB 40.

The keying profile 48 also forms first and second current fingers 54a, 54b which extend from the perimeter 46 of the PCB 40 and are spaced from one another by a current spacing perimeter portion 56. In this way, the first current mating member 24 includes first and second current mating member portions 24a, 24b. The first current finger 54a defines a length $L_{C1}$ of the first current mating member portion 24a, and the second current finger 54b defines a length $L_{C2}$ of the second current mating member portion 24b.

Each of the first and second current fingers 54a, 54b includes a first interference member portion 58a, 58b which extends from a respective current finger 54a, 54b.

Each current finger 54a, 54b has separate current poles (not shown) which provide the current connection to the primary current transformer 14. One of the current poles is on one face of the PCB 40 while the other pole is on the opposite face of the PCB 40.

The first voltage mating member 26 and first current mating member 24 are spaced from one another along the perimeter 46 of the PCB 40 by a member spacing perimeter portion 60.

Figure 4:
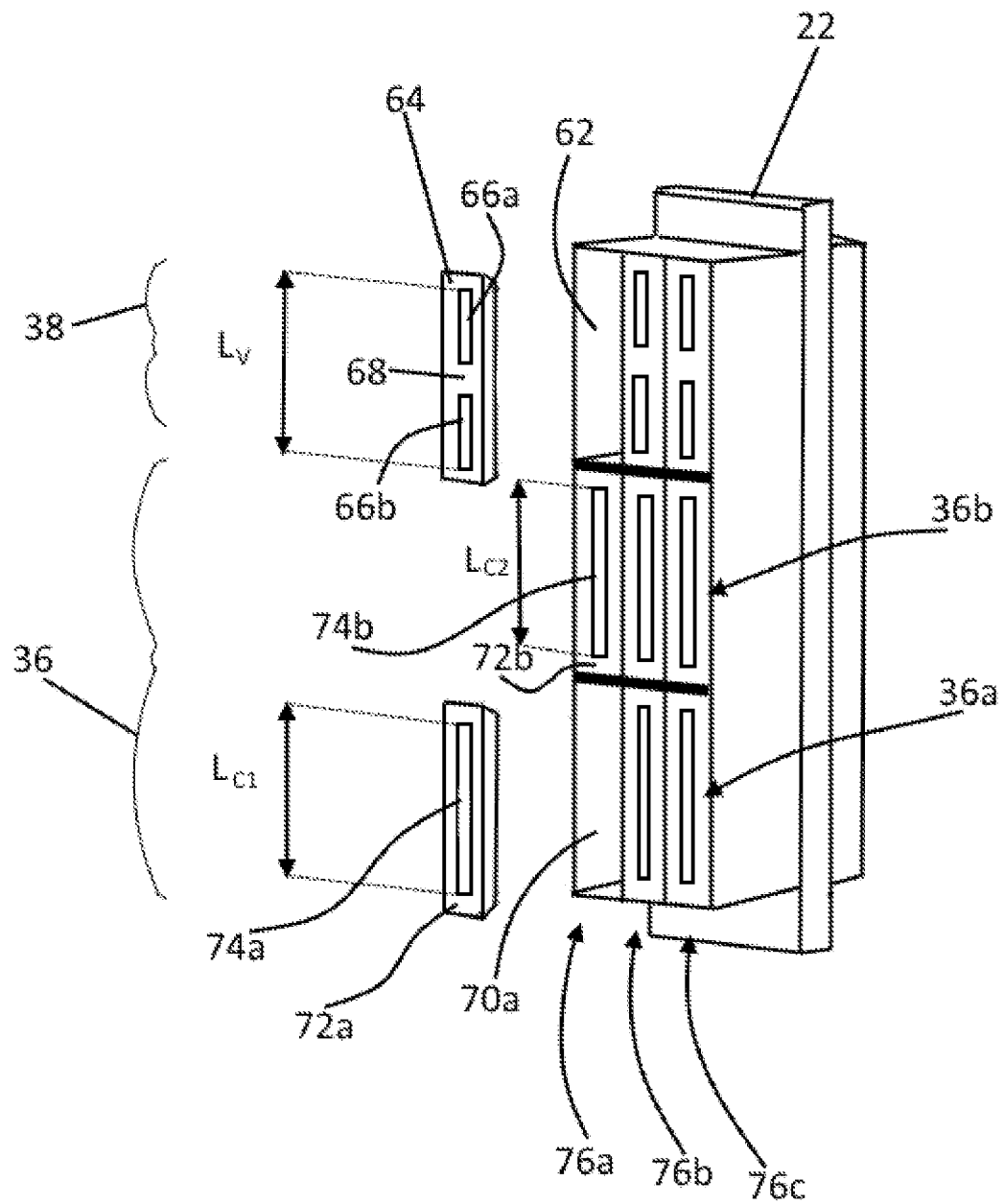
FIG. 4 shows a schematic view of the protection relay connector shown in FIG. 2.

Further features of the protection relay connector 22 are now described in relation to FIG. 4. The protection relay connector 22 includes a voltage aperture 62 and a voltage mating member cover 64 that extends across the voltage aperture 62 so as to provide the second voltage mating member 38. The voltage mating member cover 64 is used together with metal contacts (not shown) housed within the voltage aperture 62 to create a connector voltage channel.

More specifically, the voltage mating member cover 64 includes first and second voltage mating apertures (in the form of slots in the embodiment shown) 66a, 66b shaped to receive the first and second voltage fingers 50a, 50b. The first and second voltage mating slots 66a, 66b are in line with one another and are spaced from each other by a second interference member portion 68.

The first and second voltage mating slots 66a, 66b and the interference member portion 68 define an overall length $L_V$ of the second voltage mating member 38 which is equal to the overall length $L_V$ of the first voltage mating member 26 (taking into account any tolerance stack-up). Moreover, the individual length of each of the first and second voltage mating slots 66a, 66b is equal to the individual length of each of the first and second voltage fingers 50a, 50b. As such, the first and second voltage fingers 50a, 50b are inserted into the first and second voltage mating slots 66a, 66b so as to mate the first voltage mating member 26 with the second voltage mating member 38.

The protection relay connector 22 further includes first and second current apertures 70a, 70b and first and second current mating member covers 72a, 72b that each extend across a corresponding first and second current aperture 70a, 70b, thus defining first and second current mating member portions 36a, 36b. The current mating member covers 72a, 72b together with metal contacts (not shown) housed within the first and second current apertures 70a, 70b creates first and second connector current channels.

More specifically, the first current mating member cover 72a includes a first current mating aperture (in the form of a single slot in this embodiment) 74a shaped to receive the first current finger 54a, and the second current mating member cover 72b includes a second current mating aperture (also in the form of a single slot) 74b shaped to receive the second current finger 54b.

Each current mating slot 74a, 74b defines a length $L_{C1}$, $L_{C2}$ of a respective first and second current mating member portion 36a, 36b of the second current mating member 36, which is equal to the length $L_{C1}$, $L_{C2}$ of each of the first and second current fingers 54a, 54b (taking into account any tolerance stack-up).

As such, the first and second current fingers 54a, 54b are inserted into a corresponding current mating slot 74a, 74b so as to mate the first current mating member 24 with the second current mating member 36.

The overall length $L_V$ of the voltage fingers 50a, 50b of the PCB 40 is longer than the length $L_{C1}$, $L_{C2}$ of either of the current mating slots 74a, 74b of the protection relay connector 22. Therefore, the voltage fingers 50a, 50b will not fit in either of the current mating slots 74a, 74b, such that mating of the first voltage mating member 26 with the second current mating member 36 is prevented.

Meanwhile, the first interference member portion 58a, 58b of either of the first and second current fingers 54a, 54b abuts the second interference member portion 68 of the second voltage mating member 38. Therefore, neither of the first and second current fingers 54a, 54b will fit into the voltage mating slots 66a, 66b, such that mating of the first current mating member 24 with the second voltage mating member 38 is prevented.

In other embodiments of the invention (not shown), the first and second current and voltage mating members 24, 26, 36, 38 may take any other suitable shape which permits the mating of the first and second current mating members 24, 36 with one another and the first and second voltage mating members 26, 38 with another, while preventing mating of the first current mating member 24 with the second voltage mating member 38 and mating of the first voltage mating member 26 with the second current mating member 36.

In such other embodiments, the shape of the first and second current and voltage mating members 24, 26, 36, 38 may be such that the second current and voltage mating members 36, 38 are inserted into the first current and voltage mating members 24, 26.

In further embodiments of the invention (not shown), the protection relay connector 22 may instead include a single connector current channel (i.e. a single current aperture 70a, corresponding current mating member cover 72a and metal contact), and two connector voltage channels (i.e. two voltage apertures 62, corresponding voltage mating member covers 64 and metal contacts). In such an embodiment, the first current mating member 24 may be formed from a single current member portion 24a, i.e. a single current finger 54a with one current pole for connecting to the primary current transformer 14 being provided on one face of the protection relay data acquisition board 20, and the other current pole for connecting to the primary current transformer 14 being provided on the other opposite face of the protection relay data acquisition board 20.

As shown in FIG. 4, the protection relay connector 22 includes three sets 76a, 76b, 76c of second current and voltage members 36, 38. Each set 76a, 76b, 76c may be connected to a different phase of the electrical network 12. Each set 76a, 76b, 76c may instead be connected at different locations of the same phase of the electrical network 12. In each case, separate PCBs 40 would be provided to mate with each set 76a, 76b, 76c of second current and voltage members 36, 38.

In other embodiments of the invention (not shown), the first and second current mating members 24, 36 share a common current visual indicator and the first and second voltage mating members 26, 38 share a common voltage visual indicator. The current and voltage visual indicators are different from one another. For example, a colour coding could be used on both the protection relay data acquisition board 20 and the protection relay connector 22 to indicate whether a particular connection is configured for use with current or voltage transformer channels. The coding may also indicate the operating phase of the connection.

In use, the current connections of the primary current transformer 14 are connected to the first and second current apertures 70a, 70b of the protection relay connector 22 via the metal contacts. Moreover, the voltage connections of the primary voltage transformer 16 are connected to the voltage apertures 62 of the protection relay connector 22 via the metal contacts.

The protection relay data acquisition board 20 is mated to the protection relay connector 22 via respective current and voltage mating members 24, 26, 36, 38. In particular, the first voltage finger 50a of the PCB 40 is inserted into the first voltage mating slot 66a of the voltage mating member cover 64, and the second voltage finger 50b of the PCB 40 is inserted into the second voltage mating slot 66b of the voltage mating member cover 64. At the same time, the first current finger 54a is inserted into the first current mating slot 74a of the first current mating member cover 72a, and the second current finger 54b is inserted into the second current mating slot 74b of the second current mating member cover 72b.

As such, the shunt 42 provided on the PCB 40 is connected to the current connections of the primary current transformer 14, while the voltage divider 44 provided on the PCB 40 is connected to the voltage connections of the primary voltage transformer 16.

The protection relay 18 may be connected to a circuit breaker (not shown) which is in turn connected to the electrical network 12.

If the PCB 40 is attempted to be inserted into the protection relay connector 22 upside down, the first interference member portion 58a of the first current finger 54a will abut the second interference member portion 68 of the voltage mating member cover 64. Moreover, the first and second voltage fingers 50a, 50b will abut the top edges of the first current mating slot 74a due to the overall length $L_V$ of the voltage fingers 50a, 50b being longer than the length $L_{C1}$ of the first current mating slot 74a.

Accordingly, the PCB 40 will be prevented from being inserted into the protection relay connector 22, and thus incorrect connection of the current and voltage channels to the primary current and voltage transformers 14, 16 is prevented.

Once the PCB 40 has been inserted correctly, the primary current and voltage transformers 14, 16 feed measured current and voltage waveforms of the electrical network 12 to the shunt 42 and voltage divider 44 via the protection relay connector 22. The shunt 42 converts the measured current waveform into a representative current waveform and the voltage divider 44 converts the measured voltage waveform into a representative voltage waveform. The digital-to-analogue converter (not shown) on the PCB 40 then produces respective digital representations of the current and voltage waveforms for inputting to the protection relay 18.

In this way, measured current and voltage waveforms of the electrical network 12 are transmitted to the protection relay 18.

The protection relay 18 can then trigger the circuit breaker upon detection of a fault on the electrical network 12 based on the current and voltage measurements.

The invention claimed is:

1. A protection relay connection assembly for connecting a current transformer and/or a voltage transformer of an electrical network to a protection relay, the protection relay connection assembly comprising:
   a protection relay data acquisition board including a first current mating member connectable to a current measurement sensor, the current measurement sensor being connectable in use to the protection relay and/or a first voltage mating member connectable to a voltage measurement sensor, the voltage measurement sensor being connectable in use to the protection relay; and
   a protection relay connector including a second current mating member connectable to the current transformer and/or a second voltage mating member connectable to the voltage transformer,
   wherein the first current mating member and the second current mating member are shaped to be selectively mateable with one another to permit a measured current waveform of the electrical network to be transmitted from the current transformer to the protection relay and the first voltage mating member and the second voltage mating member are shaped to be selectively mateable with one another to permit a measured voltage waveform of the electrical network to be transmitted from the voltage transformer to the protection relay, and
   wherein the first current mating member is shaped to prevent mating of the first current mating member with the second voltage mating member, and the first voltage mating member is shaped to prevent mating of the first voltage mating member with the second current mating member,
   wherein the current measurement sensor is or includes a shunt provided on the protection relay data acquisition board, and/or the voltage measurement sensor is or includes a voltage divider provided on the protection relay data acquisition board.

2. The protection relay connection assembly according to claim 1 wherein the current measurement sensor is connected to the first current mating member and/or the voltage measurement sensor is connected to the first voltage mating member.

3. The protection relay connection assembly according to claim 2 wherein the current measurement sensor is configured to convert a measured current waveform of the electrical network to a representative current waveform to be utilized by the protection relay, and/or wherein the voltage measurement sensor is configured to convert a measured voltage waveform of the electrical network to a representative voltage waveform to be utilized by the protection relay.

4. The protection relay connection assembly according to claim 1 wherein the protection relay data acquisition board includes the first current mating member, the first current mating member has at least one dimension that is larger than the corresponding dimension of the second voltage mating member so as to prevent mating of the first current mating member with the second voltage mating member.

5. The protection relay connection assembly according to claim 1 wherein the protection relay data acquisition board includes the first voltage mating member, the first voltage mating member has at least one dimension that is larger than the corresponding dimension of the second current mating member so as to prevent mating of the first voltage mating member with the second current mating member.

6. The protection relay connection assembly according to claim 1 wherein the protection relay data acquisition board includes the first current mating member, the first current mating member includes a first interference member portion and the second voltage mating member includes a second interference member portion, the first and second interference member portions being shaped to physically interfere with each other to prevent mating of the first current mating member with the second voltage mating member.

7. The protection relay connection assembly according to claim 1 wherein the protection relay data acquisition board includes the first voltage mating member, the first voltage mating member includes a first interference member portion and the second current mating member includes a second interference member portion, the first and second interference member portions being shaped to physically interfere with each other to prevent mating of the first voltage mating member with the second current mating member.

8. The protection relay connection assembly according to claim 1 wherein the first and second current mating members are associated with at least one current visual indicator and/or the first and second voltage mating members are associated with at least one voltage visual indicator, the current and voltage visual indicators differing from one another.

9. The protection relay connection assembly according to claim 1 wherein the protection relay data acquisition board is shaped so that the first current mating member is integrally formed with the protection relay data acquisition board and/or the first voltage mating member is integrally formed with the protection relay data acquisition board.

10. The protection relay connection assembly according to claim 1 wherein the first current mating member has separate poles on opposite faces of the protection relay data acquisition board, each pole being configured to connect to a respective pole of the current transformer of the electrical network and/or the first voltage mating member has separate poles on the protection relay data acquisition board, each pole being configured to connect to a respective pole of the voltage transformer of the electrical network.

11. The protection relay connection assembly according to claim 1 wherein the first current mating member includes first and second mating member portions, each of the first and second mating member portions having a separate pole, each pole being configured to connect to a respective pole of the current transformer of the electrical network and/or the first voltage mating member includes first and second mating member portions, each of the first and second mating member portions having a separate pole, each pole being configured to connect to a respective pole of the voltage transformer of the electrical network.

12. The protection relay connection assembly according to claim 1 wherein the protection relay connector includes a current aperture configured to receive the first current mating members and/or the protection relay connector includes a voltage aperture configured to receive the first voltage mating member.

13. The protection relay connection assembly according to claim 12 wherein the protection relay connector further includes a current mating member cover extending across the current aperture to provide the second current mating member, and/or a voltage mating member cover extending across the voltage aperture to provide the second voltage mating member.

14. A protection apparatus for protecting an electrical network, the protection apparatus comprising:
   a protection relay connection assembly comprising:
      a protection relay including a first current mating member connectable to a current measurement sensor, the current measurement sensor being connectable in use to the protection apparatus and/or a first voltage mating member connectable to a voltage measurement sensor, the voltage measurement sensor being connectable in use to the protection apparatus; and a protection relay connector including a second current mating member connectable to a current transformer and/or a second voltage mating member connectable to the a voltage transformer, wherein the first current mating member and the second current mating member are shaped to be selectively mateable with one another to permit a measured current waveform of the electrical network to be transmitted from the current transformer to the protection apparatus and the first voltage mating member and the second voltage mating member are shaped to be selectively mateable with one another to permit a measured voltage waveform of the electrical network to be transmitted from the voltage transformer to the protection apparatus, and wherein the first current mating member is shaped to prevent mating of the first current mating member with the second voltage mating member, and the first voltage mating member is shaped to prevent mating of the first voltage mating member with the second current mating member; and the protection apparatus further comprising one or more inputs electrically coupled with the current and/or voltage measurement sensors, the protection apparatus being configured to be capable of selectively triggering a protective function based on the measured current and/or voltage waveforms to protect the electrical network, wherein the current measurement sensor is or includes a shunt provided on the protection relay, and/or the voltage measurement sensor is or includes a voltage divider provided on the protection relay.

* * * * *

UNITED STATES PATENT AND TRADEMARK OFFICE
CERTIFICATE OF CORRECTION

PATENT NO. : 11,223,165 B2
APPLICATION NO. : 16/612244
DATED : January 11, 2022
INVENTOR(S) : Timothy Fawcett, Simon Kidd and Paul Aston It is certified that error appears in the above-identified patent and that said Letters Patent is hereby corrected as shown below:

On the Title Page

The Title, and in the Specification, Column 1, Line 1, please change "OR RELATING TO PROTECTION RELAYS" to -- IMPROVEMENTS IN OR RELATING TO PROTECTION RELAYS --

Signed and Sealed this
Twenty-first Day of June, 2022

Katherine Kelly Vidal
*Director of the United States Patent and Trademark Office*